(12) United States Patent
Chien

(10) Patent No.: US 6,213,636 B1
(45) Date of Patent: Apr. 10, 2001

(54) FURNACE FOR TESTING INTEGRATED CIRCUITS

(75) Inventor: Tze-Zen Chien, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/137,625

(22) Filed: Aug. 21, 1998

(51) Int. Cl.[7] .................. G01N 25/72; G01M 19/00; G01R 31/303; G01R 31/311
(52) U.S. Cl. .............................. 374/57; 324/760
(58) Field of Search ................. 73/865.6, 865.9; 374/57; 324/760

(56) References Cited

U.S. PATENT DOCUMENTS

| | | | |
|---|---|---|---|
| 3,365,930 | * | 1/1968 | Arias .................... 374/57 X |
| 3,648,167 | * | 3/1972 | Purdy et al. ............. 324/760 |
| 4,520,312 | * | 5/1985 | Tarng et al. ............. 324/760 |
| 4,954,774 | * | 9/1990 | Binet .................... 324/760 |
| 5,035,905 | * | 7/1991 | Figal .................... 324/760 |
| 5,039,228 | * | 8/1991 | Chalmers ............... 73/865.6 X |
| 5,193,910 | * | 3/1993 | Kinoshita .............. 374/57 X |
| 5,318,361 | * | 6/1994 | Chase et al. ........... 73/865.6 X |
| 5,723,796 | * | 3/1998 | Nielsen ................. 73/865.6 |
| 5,746,512 | * | 5/1998 | Yao et al. .............. 374/57 X |

FOREIGN PATENT DOCUMENTS

| | | | |
|---|---|---|---|
| 59-161833 | * | 9/1984 | (JP) ............... 374/57 |
| 59-181076 | * | 10/1984 | (JP) .............. 324/760 |
| 60-33031 | * | 2/1985 | (JP) ............... 374/57 |
| 63-50769 | * | 3/1988 | (JP) ............... 374/57 |

OTHER PUBLICATIONS

TDB–Acc–No; NN 81091842; IBM Technical Disclosure Bulletin; "Highly Accelerated Stress Test" vol. 24, No. 4, pp. 1842–1843, Sep., 1981.*

TDB–Acc–No; NA9006308; IBM Technical Disclosure Bulletin, vol. 33, No. 1A, p. 308 Gas Jet Manifold for Module Cooling in Belt–Type Chip–Joining, Furnace; Jun. 1990.*

* cited by examiner

*Primary Examiner*—Thomas P. Noland
(74) *Attorney, Agent, or Firm*—Dellett and Walters

(57) ABSTRACT

A furnace for testing integrated circuits has a furnace body for holding the integrated circuits undergoing testing. A water outlet pipe and an air exhaust pipe are connected to the furnace body. The water outlet pipe and the air exhaust pipe are automatically opened when a test is complete. An air supply pipe is connected to the furnace body. The air supply pipe is automatically opened when the test is complete for injecting low-temperature gas into the furnace body. A liquid inlet pipe is connected to the furnace body. The liquid inlet pipe is automatically opened when the test is complete for pouring cooling liquid into the furnace body. With the supply of low-temperature gas and cooling liquid, the furnace can be cooled down quickly thereby avoiding damages to the integrated circuits.

11 Claims, 2 Drawing Sheets

FURNACE FOR TESTING INTEGRATED CIRCUITS

BACKGROUND OF THE INVENTION

1. Field of the Invention

The present invention relates to a furnace for testing integrated circuits, more particularly, to a furnace which injects low-temperature air and pours cooling liquid therein when the test is complete thereby quickly cooling down the temperature inside the furnace to avoid damaging the integrated circuits undergoing test.

2. Description of Related Art

The integrated circuits have to be tested after being produced to eliminate the defective ones and ensure their quality. Generally, two environmental tests, Pressure Cooker Test (PCT) and Highly Accelerated Stress Test (HAST), have to be performed on the integrated circuits. Usually, the PCT test is executed under an environment of 121° C./100% RH/29.7 PSI and the HAST test is executed under an environment of 130° C./85% RH/33.3 PSI. Both of the test environments are of high-temperature, high-humidity and high-pressure. The conventional method for the PCT furnace and the HAST furnace only turns off the heater and open the water outlet valve and air exhaust valve to let it cool down naturally after the test is complete. At the end of the test, both the temperature and humidity in the furnace are still very high and drop slowly, therefore the integrated circuits are in an idle-burning state. Moreover, it is easy to generate condensation inside the furnace and on the integrated circuits in such a cool-down process. Because of the above idle-burning and condensation-generation phenomenon, the integrated circuits are likely to be damaged; for example, water-spots and color-veins may be generated on the plastic packages thereof and the leads thereof may be blackened. The damaged integrated circuits have lots of problems such as bad conductivity, open circuits or broken leads.

SUMMARY OF THE INVENTON

Therefore it is the object of the present invention to provide a furnace for testing integrated circuits, which is able to quickly lower the temperature in the furnace when the test is complete thereby avoiding damage to the integrated circuits.

A furnace for testing integrated circuits in accordance with the present invention comprises a furnace body, a water outlet pipe, an air exhaust pipe, an air supply pipe and a liquid inlet pipe. The air supply pipe is automatically opened when the test is complete thereby injecting low-temperature air into the furnace body. The liquid inlet pipe is automatically opened when the test is complete thereby pouring cooling liquid into the furnace body.

Other objects, advantages, and novel features of the invention will become more apparent from the following detailed description when taken in conjunction with the accompanying drawings.

DETAILED DESCRIPTION OF PREFERRED EMBODIMENT

Figure 1:
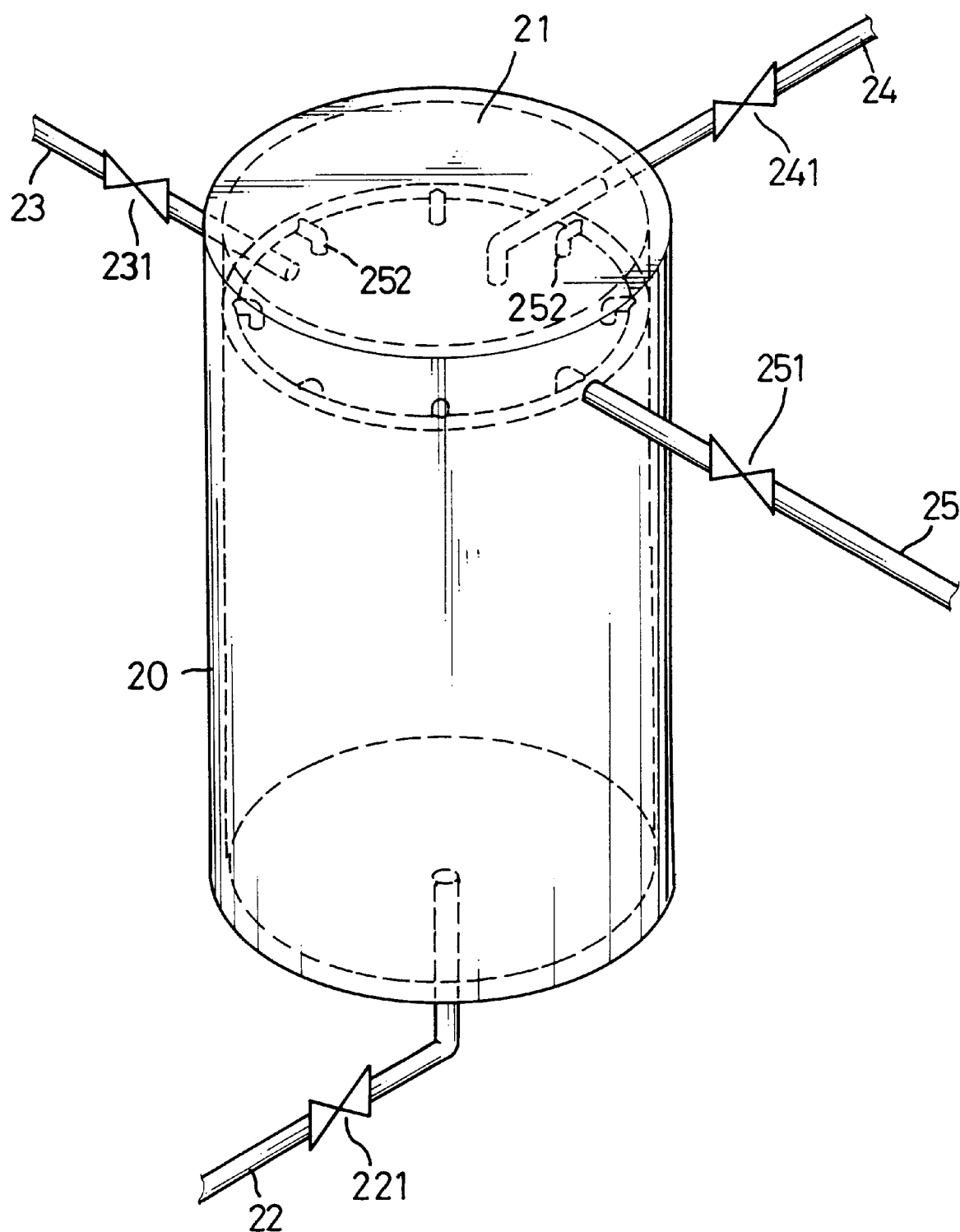
FIG. 1 is a schematic diagram showing a PCT furnace in accordance with the present invention.

FIG. 1 shows a PCT furnace having a furnace body (20) for holding the integrated circuits undergoing test. A lid (21) seals the furnace body (20). When a PCT test is in process, a high-temperature, high-humidity and high-pressure environment can be created by using a heater (not shown) located at the bottom of the furnace body (20). The PCT furnace has a water outlet pipe (22) connected to the bottom portion of the furnace body (20) and an air exhaust pipe (23) connected to the upper portion of the furnace body (20). The water outlet and the air exhaust are controlled by a water outlet valve (221) and an air exhaust valve (231), respectively. The water outlet valve (221) and the air exhaust valve (231) are both automatically opened when a test is complete. In addition, the PCT furnace has an air supply pipe (24) detachably connected to the upper portion of the furnace body (20). The air supply pipe (24) can be detached from the furnace body (20) whereby the integrated circuits can be placed into the furnace body (20) conveniently. The air supply is controlled by an air supply valve (241) which is automatically opened when the test is complete to inject low-temperature gas such as Nitrogen ($N_2$) with a pressure of 2.3~3.0 atm into the furnace body (20). Furthermore, the PCT furnace has a liquid inlet pipe (25) connected to the upper portion of the furnace body (20). The liquid inlet pipe (25) extends along the inner periphery of the furnace body (20) and has a plurality of output ports (252). The liquid inlet is controlled by a liquid inlet valve (251) which is automatically opened when the test is complete to pour cooling liquid such as deionized water (DI water) with a pressure of 1~2 kg/cm$^2$ toward the inner face of the furnace body (20) from the plurality of output ports (252). As a result, the furnace body (20) of the PCT furnace can be cooled down quickly after the test is complete.

Figure 2:
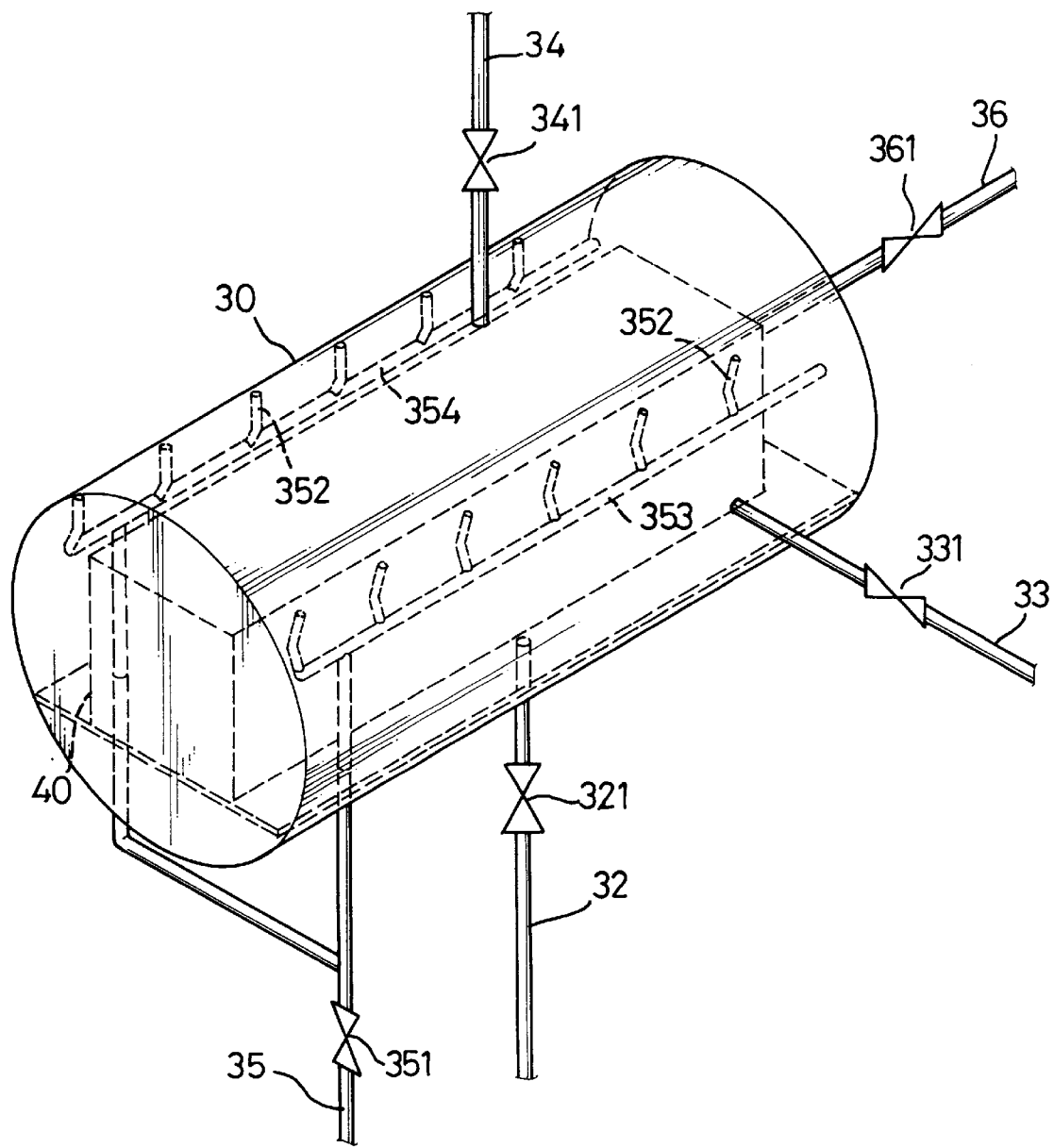
FIG. 2 is a schematic diagram showing a HAST furnace in accordance with the present invention.

FIG. 2 shows a HAST furnace having a furnace body (30) for accommodating a burn-in rack (40) which holds the integrated circuits undergoing test. A humidity supply pipe (36), controlled by a humidity supply valve (361), can be provided for connection with the furnace body (30) to create a high-temperature, high-humidity and high-pressure environment when a HAST test is in process. The HAST furnace has a water outlet pipe (32) connected to the bottom portion of the furnace body (30) and an air exhaust pipe (33) connected to one side of the furnace body (30). The water outlet and the air exhaust are controlled by a water outlet valve (321) and an air exhaust valve (331), respectively. The water outlet valve (321) and the air exhaust valve (331) are both automatically opened when a test is complete. In addition, the HAST furnace has an air supply pipe (34) connected to the upper portion of the furnace body (30). The air supply is controlled by an air supply valve (341) which is automatically opened when the test is complete to inject low-temperature gas such as Nitride ($N_2$) with a pressure of 2.3~3.0 atm into the furnace body (30). Furthermore, the PCT furnace has a liquid inlet pipe (35) connected to the furnace body (30). The liquid inlet pipe (35) is split to two sub-pipes (353,354), each extending along one side of the inner face of the furnace body (30) and having a plurality of output ports (352). The liquid inlet is controlled by a liquid inlet valve (351) which is automatically opened when the test is complete to pour cooling liquid such as deionized water (DI water) with a pressure of 1~2 kg/cm$^2$ toward the inner face of the furnace body (30) from the plurality of output ports (352). As a result, the furnace body (30) of the HAST furnace can be cooled down quickly after the test is complete.

Although the present invention has been explained in relation to its preferred embodiment, it is to be understood that many other possible modifications and variations can be made without departing from the spirit and scope of the invention as hereinafter claimed.

What is claimed is:

1. A furnace for testing integrated circuits, comprising:
   a furnace body for holding said integrated circuits undergoing testing;
   a water outlet means connected to said furnace body, said water outlet means being opened when a test is complete;
   an air exhaust means connected to said furnace body, said air exhaust means being opened when said testing is complete;
   a gas supply means connected to said furnace body, said gas supply means being opened to inject a low-temperature gas into said furnace body when said testing is complete;
   a liquid inlet means connected to said furnace body, said liquid inlet means being opened to pour cooling liquid into said furnace body when said testing is complete.

2. The furnace for testing integrated circuits as claimed in claim 1, wherein said gas supply means has a gas supply valve and a gas supply pipe controlled by said gas supply valve.

3. The furnace for testing integrated circuits as claimed in claim 2, wherein said liquid inlet means has a liquid inlet valve and a liquid inlet pipe controlled by said liquid inlet valve, said liquid inlet pipe extending along an inner face of said furnace body and having a plurality of output ports for pouring said cooling liquid toward the inner face of said furnace body.

4. The furnace for testing integrated circuits as claimed in claim 3, wherein said low-temperature gas is nitrogen.

5. The furnace for testing integrated circuits as claimed in claim 4, wherein said cooling liquid is deionized water.

6. A furnace for performing a pressure cooker test on integrated circuits having a furnace body for holding said integrated circuits undergoing testing, a water outlet valve which is opened when said testing is complete, a water outlet pipe connected to said furnace body and controlled by said water outlet valve, an air exhaust valve which is opened when said testing is complete, and an air exhaust pipe connected to said furnace body and controlled by said air exhaust valve, wherein the improvement comprises:
   a gas supply valve which is opened when said testing is complete;
   a gas supply pipe detachably connected to an upper portion of said furnace body and controlled by said gas supply valve for injecting a low-temperature gas into said furnace body;
   a liquid inlet valve which is opened when said testing is complete; and
   a liquid inlet pipe connected to the upper portion of said furnace body and extending along a periphery of an inner face of said furnace body, said liquid inlet pipe having a plurality of output ports and controlled by said liquid inlet valve for pouring cooling liquid toward the inner face of said furnace body from said plurality of output ports.

7. The furnace for performing a pressure cooker test on integrated circuits as claimed in claim 6, wherein said low-temperature gas is nitrogen.

8. The furnace for performing a pressure cooker test on integrated circuits as claimed in claim 7, wherein said cooling liquid is deionized water.

9. A furnace for performing a highly accelerated stress test on integrated circuits having a furnace body for holding said integrated circuits undergoing testing, a water outlet valve which is opened when said testing is complete, a water outlet pipe connected to said furnace body and controlled by said water outlet valve, a gas exhaust valve which is opened when the testing is complete, and a gas exhaust pipe connected to said furnace body and controlled by said gas exhaust valve, wherein the improvement comprises:
   a gas supply valve which is opened when said testing is complete;
   a gas supply pipe connected to an upper portion of said furnace body and controlled by said gas supply valve for injecting a low-temperature gas into said furnace body;
   a liquid inlet valve which is opened when said testing is complete; and
   a liquid inlet pipe connected to said furnace body and split to two sub-pipes, each extending along one side of an inner face of said furnace body and having a plurality of output ports, said liquid inlet pipe being controlled by said liquid inlet valve for pouring cooling liquid toward the inner face of said furnace body from said plurality of output ports.

10. The furnace for performing a pressure cooker test on integrated circuits as claimed in claim 9, wherein said low-temperature gas is nitrogen.

11. The furnace for performing a pressure cooker test on integrated circuits as claimed in claim 10, wherein said cooling liquid is deionized water.

* * * * *